United States Patent
Der et al.

(10) Patent No.: US 8,521,099 B2
(45) Date of Patent: Aug. 27, 2013

(54) TRANSCEIVER HAVING MULTIPLE SIGNAL PROCESSING MODES OF OPERATION

(75) Inventors: Lawrence Der, Austin, TX (US); George Tyson Tuttle, Austin, TX (US); Alessandro Piovaccari, Austin, TX (US); Chunyu Xin, Austin, TX (US); Scott Haban, Austin, TX (US); Javier Elenes, Austin, TX (US); Dan Kasha, Seattle, WA (US); Peter Vancorenland, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 783 days.

(21) Appl. No.: 11/824,568

(22) Filed: Jun. 29, 2007

(65) Prior Publication Data

US 2008/0049817 A1     Feb. 28, 2008

Related U.S. Application Data

(63) Continuation-in-part of application No. 11/396,097, filed on Mar. 31, 2006.

(51) Int. Cl.
    *H04B 1/38*      (2006.01)
(52) U.S. Cl.
    USPC .................................. 455/73; 455/78; 455/83
(58) Field of Classification Search
    USPC .......................................................... 455/73
    See application file for complete search history.

(56) References Cited

U.S. PATENT DOCUMENTS

| | | | | |
|---|---|---|---|---|
| 5,129,098 A | * | 7/1992 | McGirr et al. | 455/69 |
| 5,220,557 A | * | 6/1993 | Kelley | 370/345 |
| 5,619,531 A | * | 4/1997 | Taylor et al. | 375/222 |
| 6,590,943 B1 | * | 7/2003 | Ali | 375/332 |
| 6,744,247 B2 | * | 6/2004 | Oetjen et al. | 324/76.19 |
| 7,053,805 B2 | * | 5/2006 | Chang et al. | 341/120 |
| 2002/0168952 A1 | * | 11/2002 | Vishakhadatta et al. | 455/130 |
| 2003/0151399 A1 | * | 8/2003 | Oetjen et al. | 324/76.19 |
| 2003/0203743 A1 | * | 10/2003 | Sugar et al. | 455/550.1 |
| 2004/0030227 A1 | * | 2/2004 | Littrup et al. | 600/300 |
| 2004/0042539 A1 | * | 3/2004 | Vishakhadatta et al. | 375/216 |
| 2004/0064043 A1 | * | 4/2004 | Rielly et al. | 600/437 |
| 2004/0077327 A1 | * | 4/2004 | Lim et al. | 455/318 |
| 2004/0106380 A1 | * | 6/2004 | Vassiliou et al. | 455/73 |
| 2004/0141562 A1 | * | 7/2004 | Plisch et al. | 375/259 |
| 2004/0219884 A1 | * | 11/2004 | Mo et al. | 455/67.11 |

(Continued)

FOREIGN PATENT DOCUMENTS

| | | |
|---|---|---|
| CN | 14575555 A | 11/2003 |
| WO | 2004100398 | 11/2004 |

*Primary Examiner* — Nay A Maung
*Assistant Examiner* — Erica Fleming-Hall
(74) *Attorney, Agent, or Firm* — Trop, Pruner & Hu, P.C.

(57) ABSTRACT

A transceiver includes a processor, which is adapted to in a transmit mode of the transceiver, form at least part of a transmitter and in a receive mode of the transceiver, form at least part of a receiver. The transceiver may include at least one analog-to-digital converter to provide digital signals to the processor in both the transmit and receive modes of operation; and the transceiver may include at least one digital-to-analog converter to receive digital signals from the processor in the transmit and receive modes of operation. The processor may be fabricated on an integrated circuit with at least one of the analog-to-digital converters and/or with at least one of the digital-to-analog converters.

16 Claims, 16 Drawing Sheets

(56) References Cited

U.S. PATENT DOCUMENTS

| | | | |
|---|---|---|---|
| 2004/0242224 A1* | 12/2004 | Janik et al. | 455/426.1 |
| 2005/0113058 A1* | 5/2005 | Gosieski, Jr. | 455/345 |
| 2005/0159116 A1* | 7/2005 | Xiong | 455/127.1 |
| 2005/0233768 A1* | 10/2005 | Guo et al. | 455/557 |
| 2005/0286660 A1* | 12/2005 | Nysen et al. | 375/343 |
| 2006/0293018 A1* | 12/2006 | Reynolds | 455/324 |
| 2007/0054629 A1* | 3/2007 | Maligeorgos et al. | 455/88 |
| 2007/0069929 A1* | 3/2007 | Mallinson | 341/143 |
| 2007/0105504 A1* | 5/2007 | Vorenkamp et al. | 455/73 |
| 2007/0120722 A1* | 5/2007 | Nygard et al. | 341/155 |
| 2007/0168579 A1* | 7/2007 | Croughwell et al. | 710/22 |
| 2008/0002597 A1* | 1/2008 | Fan et al. | 370/280 |
| 2008/0298456 A1* | 12/2008 | Haggis et al. | 375/238 |
| 2009/0028365 A1* | 1/2009 | Nygard et al. | 381/312 |
| 2009/0253385 A1* | 10/2009 | Dent et al. | 455/83 |
| 2010/0099366 A1* | 4/2010 | Sugar et al. | 455/75 |
| 2010/0167684 A1* | 7/2010 | Kerth | 455/339 |
| 2011/0009080 A1* | 1/2011 | Seendripu et al. | 455/142 |

* cited by examiner

| Mode | RX | LT | LO | DO | DI | COMMENT |
|---|---|---|---|---|---|---|
| 1 | 1 | 0 | 0 | 0 | 0 | INVALID MODE |
| 2 | 1 | 0 | 0 | 0 | 1 | INVALID MODE |
| 3 | 1 | 0 | 0 | 1 | 0 | |
| 4 | 1 | 0 | 0 | 1 | 1 | |
| 5 | 1 | 0 | 1 | 0 | 0 | |
| 6 | 1 | 0 | 1 | 0 | 1 | |
| 7 | 1 | 0 | 1 | 1 | 0 | |
| 8 | 1 | 0 | 1 | 1 | 1 | |
| 9 | 1 | 1 | 0 | 0 | 0 | INVALID MODE |
| 10 | 1 | 1 | 0 | 0 | 1 | INVALID MODE |
| 11 | 1 | 1 | 0 | 1 | 0 | |
| 12 | 1 | 1 | 0 | 1 | 1 | |
| 13 | 1 | 1 | 1 | 0 | 0 | |
| 14 | 1 | 1 | 1 | 0 | 1 | |
| 15 | 1 | 1 | 1 | 1 | 0 | |
| 16 | 1 | 1 | 1 | 1 | 1 | |

FIG. 4

| Mode | TX | LT | LI | DO | DI | COMMENT |
|---|---|---|---|---|---|---|
| 17 | 1 | 0 | 0 | 0 | 0 | INVALID MODE |
| 18 | 1 | 0 | 0 | 0 | 1 | |
| 19 | 1 | 0 | 0 | 1 | 0 | INVALID MODE |
| 20 | 1 | 0 | 0 | 1 | 1 | |
| 21 | 1 | 0 | 1 | 0 | 0 | |
| 22 | 1 | 0 | 1 | 0 | 1 | |
| 23 | 1 | 0 | 1 | 1 | 0 | |
| 24 | 1 | 0 | 1 | 1 | 1 | |
| 25 | 1 | 1 | 0 | 0 | 0 | INVALID MODE |
| 26 | 1 | 1 | 0 | 1 | 1 | |
| 27 | 1 | 1 | 0 | 1 | 0 | INVALID MODE |
| 28 | 1 | 1 | 0 | 1 | 1 | |
| 29 | 1 | 1 | 1 | 0 | 0 | |
| 30 | 1 | 1 | 1 | 0 | 1 | |
| 31 | 1 | 1 | 1 | 1 | 0 | |
| 32 | 1 | 1 | 1 | 1 | 1 | |

FIG. 6

| Mode | LT | LO | LI | DO | DI | COMMENT |
|------|----|----|----|----|----|---------|
| 33 | 0 | 0 | 0 | 0 | 0 | INVALID MODE |
| 34 | 0 | 0 | 0 | 0 | 1 | INVALID MODE |
| 35 | 0 | 0 | 0 | 1 | 0 | INVALID MODE |
| 36 | 0 | 0 | 0 | 1 | 1 | |
| 37 | 0 | 0 | 1 | 0 | 0 | |
| 38 | 0 | 0 | 1 | 0 | 1 | INVALID MODE |
| 39 | 0 | 0 | 1 | 1 | 0 | |
| 40 | 0 | 0 | 1 | 1 | 1 | |
| 41 | 0 | 1 | 0 | 0 | 0 | INVALID MODE |
| 42 | 0 | 0 | 0 | 0 | 1 | |
| 43 | 0 | 1 | 0 | 1 | 0 | INVALID MODE |
| 44 | 0 | 1 | 0 | 1 | 1 | |
| 45 | 0 | 1 | 1 | 0 | 0 | |
| 46 | 0 | 1 | 1 | 0 | 1 | |
| 47 | 0 | 1 | 1 | 1 | 0 | |
| 48 | 0 | 1 | 1 | 1 | 1 | |
| 49 | 1 | 0 | 0 | 0 | 0 | |
| 50 | 1 | 0 | 0 | 0 | 1 | INVALID MODE |
| 51 | 1 | 0 | 0 | 1 | 0 | INVALID MODE |
| 52 | 1 | 0 | 0 | 1 | 1 | |
| 53 | 1 | 0 | 1 | 0 | 0 | INVALID MODE |
| 54 | 1 | 0 | 1 | 0 | 1 | INVALID MODE |
| 55 | 1 | 0 | 1 | 1 | 0 | |
| 56 | 1 | 0 | 1 | 1 | 1 | |
| 57 | 1 | 1 | 0 | 0 | 0 | INVALID MODE |
| 58 | 1 | 1 | 0 | 0 | 1 | |
| 59 | 1 | 1 | 0 | 1 | 0 | INVALID MODE |
| 60 | 1 | 1 | 0 | 1 | 1 | |
| 61 | 1 | 1 | 1 | 0 | 0 | |
| 62 | 1 | 1 | 1 | 0 | 1 | |
| 63 | 1 | 1 | 1 | 1 | 0 | |
| 64 | 1 | 1 | 1 | 1 | 1 | |

FIG. 8

TRANSCEIVER HAVING MULTIPLE SIGNAL PROCESSING MODES OF OPERATION

This application is a continuation-in-part of U.S. patent application Ser. No. 11/396,097, entitled, "TRANSCEIVER HAVING MULTIPLE SIGNAL PROCESSING MODES OF OPERATION," filed on Mar. 31, 2006, which has a common assignee to the present application and is hereby incorporated by reference in its entirety.

BACKGROUND

The invention generally relates to a transceiver, such as a frequency modulation (FM) transceiver, which has multiple signal processing modes of operation.

Portable music players, such as dedicated MPEG Audio Level 3 (MP3) music players and multifunctional portable devices (such as cellular telephones) that are capable of playing music downloads, are ever-increasing in popularity. Due to the limited speaker capability of a typical portable music player, the player may transmit a relatively low power radio frequency (RF), frequency modulated (FM) signal to an FM receiver of a nearby stereo system for purposes of playing a song over the stereo's speaker system.

The portable music player may perform a variety of signal processing operations. For example, the player may perform FM modulation for purposes of transmitting audio content to a nearby stereo system; may perform FM demodulation for purposes of receiving content from an FM radio channel; and may perform various analog-to-digital and digital-to-analog conversions in connection with radio communications and song playback. All of the above-described functions typically increase the die area and complexity of the semiconductor packages, or "chips," of the player.

SUMMARY

In an embodiment of the invention, a transceiver includes a processor and an analog-to-digital converter. The processor is adapted to, in a transmit mode of the transceiver, form at least part of a transmitter and in a receiver mode of the transceiver, form at least part of a receiver. The analog-to-digital converter provides a first digital signal to the processor in the transmit mode and provide a second digital signal to the processor in the receive mode.

In another embodiment of the invention, a transceiver includes a processor and a digital-to-analog converter. The processor is adapted to, in a transmit mode of the transceiver form at least part of a transmitter and in a receive mode of the transceiver, form at least part of a receiver. The digital-to-analog converter receives a first digital signal from the processor in the transmit mode and receives a second digital signal from the processor in the receive mode.

Advantages and other features of the invention will become apparent from the following drawing, description and claims.

BRIEF DESCRIPTION OF THE DRAWING

FIG. 4 is a table illustrating different submodes for the FM receive mode of the multimode FM transceiver according to an embodiment of the invention.

FIG. 6 is a table illustrating different submodes for the FM transmit mode of the multimode FM transceiver according to an embodiment of the invention.

FIG. 8 is a table illustrating different submodes for the audio mode of the multimode FM transceiver according to an embodiment of the invention.

DETAILED DESCRIPTION

Figure 1:
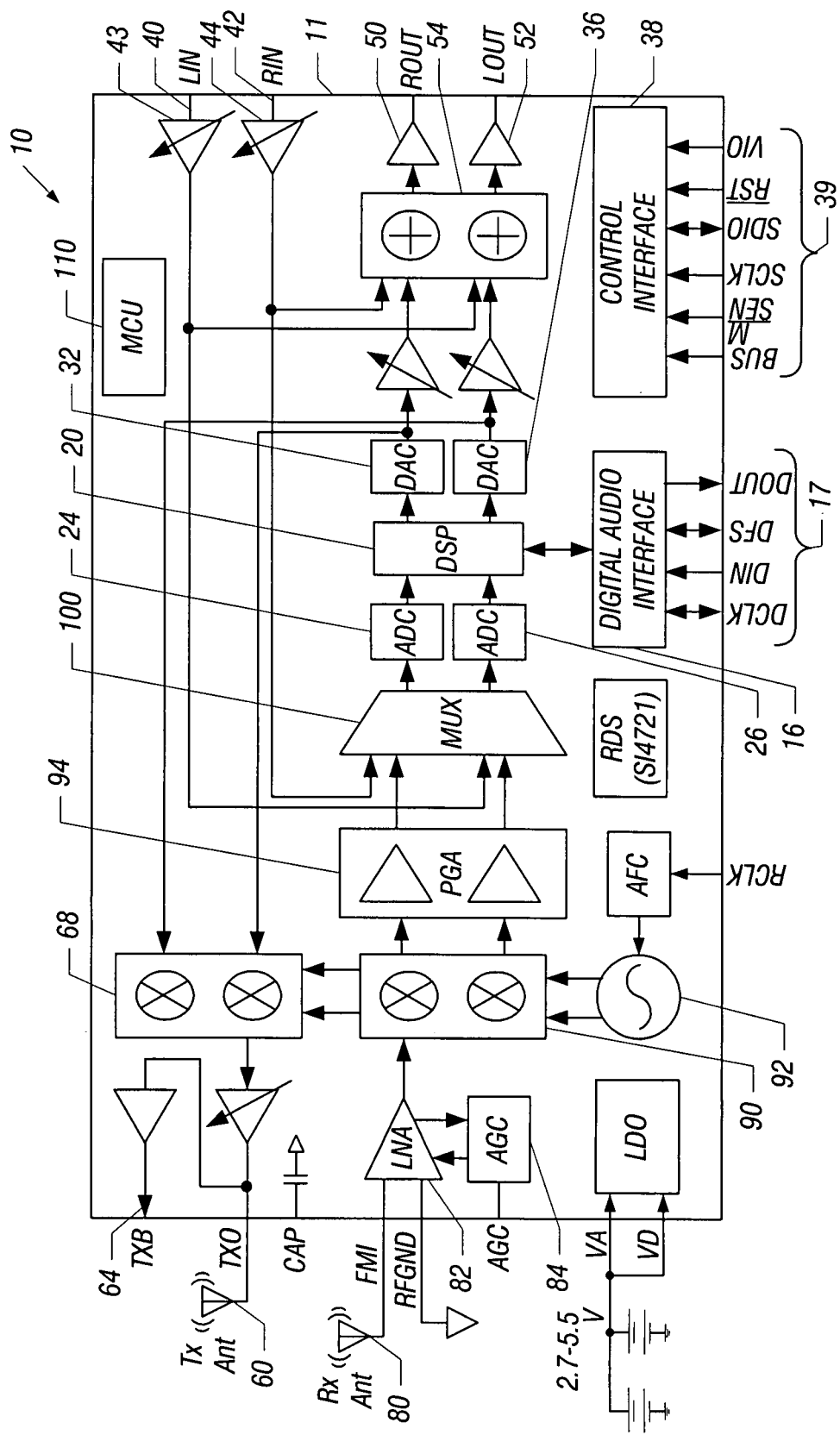
FIG. 1 is a schematic diagram of a multimode FM transceiver according to an embodiment of the invention.

Referring to FIG. 1, in accordance with embodiments of the invention described herein, a multimode frequency modulation (FM) transceiver 10, which may be fabricated on a monolithic semiconductor die 11, has several different signal processing modes of operations, in which the transceiver 10 performs FM transmission, FM reception, analog mixing, digital mixing and codec functions. More specifically, as described herein, the multimode FM transceiver 10 has an FM transmit mode in which the transceiver 10 functions as an FM transmitter; an FM receive mode in which the transceiver 10 functions as an FM receiver; and an audio mode in which the transceiver 10 functions as a codec. In each of these modes of operation, the multimedia FM transceiver 10 may perform various analog and/or digital mixing functions. Additionally, in accordance with some embodiments of the invention, the multimode FM transceiver 10 includes a digital audio interface 16, which allows the communication of digital audio signals between the transceiver 10 and circuitry ("off-chip" circuitry, for example) that is external to the transceiver 10.

In accordance with embodiments of the invention, which are described herein, the FM transmit, FM receive and audio modes are orthogonal in that the multimode FM transceiver 10 is in only one of the modes at a time. However, it is understood that in other embodiments of the invention, the multimode FM transceiver may operate in two or more of the FM receive, FM transmit and audio modes concurrently.

In general, the multimode FM transceiver 10 may receive one or more of the following input source signals in accordance with some embodiments of the invention: a digital audio (called "DIN"), which is received through the digital audio interface 16; an incoming radio frequency (RF) signal that is received from an external receive antenna 80; a digital audio band signal that is received from the digital audio interface 16; and left channel (called "LIN") and right channel (called "RIN") analog stereo channel signals that are received at input terminals 40 and 42, respectively.

Depending on the particular configuration of the multimode FM transceiver 10, the transceiver 10 is capable of mixing two or more of its input source signals together to generate one or more of the following output signals: an outgoing FM transmission signal to drive an external transmit antenna 60; left channel (called "LOUT") and right channel (called "ROUT") analog stereo signals that appear at output terminals 52 and 50, respectively; and a digital output signal (called "DOUT") that is routed through the digital audio interface 16. In accordance with some embodiments of the invention, the multimode FM transceiver 10 may also provide a low impedance RF transmission output signal (called "TXB") at an output terminal 64 for purposes of driving a low impedance load.

As described herein, the multimode FM transceiver 10 reuses some of its hardware components for purposes of reducing the complexity and size of the transceiver 10, as well as reducing the overall time that may be consumed designing the transceiver 10. For example, in accordance with some embodiments of the invention, a digital signal processor (DSP) 20 of the multimode FM transceiver 10 performs both digital FM modulation (for the FM transmit mode) and digital FM demodulation (for the FM receive mode) for the transceiver 10. As another example of the hardware reuse, analog-to-digital converters (ADCs) 24 and 26 of the multimode FM transceiver 10 perform transformations between the analog and digital domains for both complex (when the transceiver 10 is in the FM receive mode) and real (when the transceiver 10 is in the FM transmit mode) signals. Additionally, the ADCs 24 and 26 may be used in the audio mode for purposes of digitizing the LIN and RIN stereo channel signals.

As another example of hardware reuse by the multimode FM transceiver 10, in accordance with some embodiments of the invention, digital-to-analog converters (DACs) 32 and 36 of the transceiver 10 convert digital audio band signals from the digital to the analog domain for both the FM receive and audio modes. The DACs 32 and 36 are also used during the FM transmit mode for purposes of converting intermediate frequency (IF) band signals from the digital to the analog domain.

Turning now to the overall topology of the multimode FM transceiver 10, the transceiver 10 includes a multiplexer 100 for purposes of routing the appropriate analog signals to the ADCs 24 and 26 for conversion. For example, the multiplexer 100 may select an incoming analog IF signal during the FM receive mode and select the LIN and RIN stereo channel signals during the FM transmit and audio modes. The digital signals that are provided by the ADCs 24 and 26 are routed to the DSP 20.

For the FM receive mode, the multimode FM transceiver 10 includes analog mixers 90 that are coupled to a tunable local oscillator 92, the frequency of which selects the desired FM channel to which the transceiver 10 is tuned. In response to the incoming RF FM signal, the mixers 90 produce corresponding analog IF, FM quadrature signals that pass through programmable gain amplifiers (PGAs) 94 before being routed to the ADCs 24 and 26. Thus, the ADCs 24 and 26 convert the analog IF quadrature signals from the PGAs 94 into digital signals, which are provided to the DSP 20. The DSP 20 demodulates the received complex signal to provide corresponding digital left and right channel stereo signals at its output terminals; and these digital stereo signals are converted into the analog counterparts by the DACs 32 and 36, respectively. As described further below, mixing may then be performed by mixers, or analog adders 54, which provide the ROUT and LOUT stereo signals at the output terminals 50 and 52, respectively. It is noted that the digital demodulated stereo signals may also be routed from the DSP 20 to the digital audio interface 16 to produce the DOUT digital signal.

In the FM transmit mode of the multimode FM transceiver 10, the content to be transmitted over the FM channel (selected by the frequency of the local oscillator 92, for example) may originate with the DIN digital data signal, the LIN and RIN stereo channel signals or a combination of these signals. Thus, depending on whether the analog signals communicate some or all of the transmitted content, the multimode FM transceiver 10 may use the ADCs 24 and 26. The DSP 20 performs FM modulation on the content to be transmitted over the FM channel to produce digital orthogonal FM signals, which are provided to the DACs 32 and 36 to produce corresponding analog orthogonal FM signals, which are in the IF range. Analog mixers 68 (which mix the analog orthogonal FM signals with a frequency that is selected by the local oscillator 92) of the multimode FM transceiver 10 frequency translate and combine the signals to produce an RF FM signal that is provided to the transmit antenna 60.

In the audio mode of the multimode FM transceiver 10, the DSP 20 may be used to perform digital mixing. Analog mixing in the audio mode may be performed using the adder 54, as further described below.

Among the other features of the multimode FM transceiver 10, in accordance with some embodiments of the invention, the transceiver 10 includes a control interface 38 for purposes of receiving various signals 39 that control the mode (FM transmit, FM receive or audio) in which the transceiver 10 is operating, as well as the specific submode configuration for the mode, as further described below. In accordance with some embodiments of the invention, the multimode FM transceiver 10 may also include a microcontroller unit (MCU) 110 that coordinates the general operations of the transceiver 10, such as configuring the ADCs 24 and 26 and DACs 32 and 36, configuring data flow through the multiplexer 100, etc., as further described below.

Figure 2:
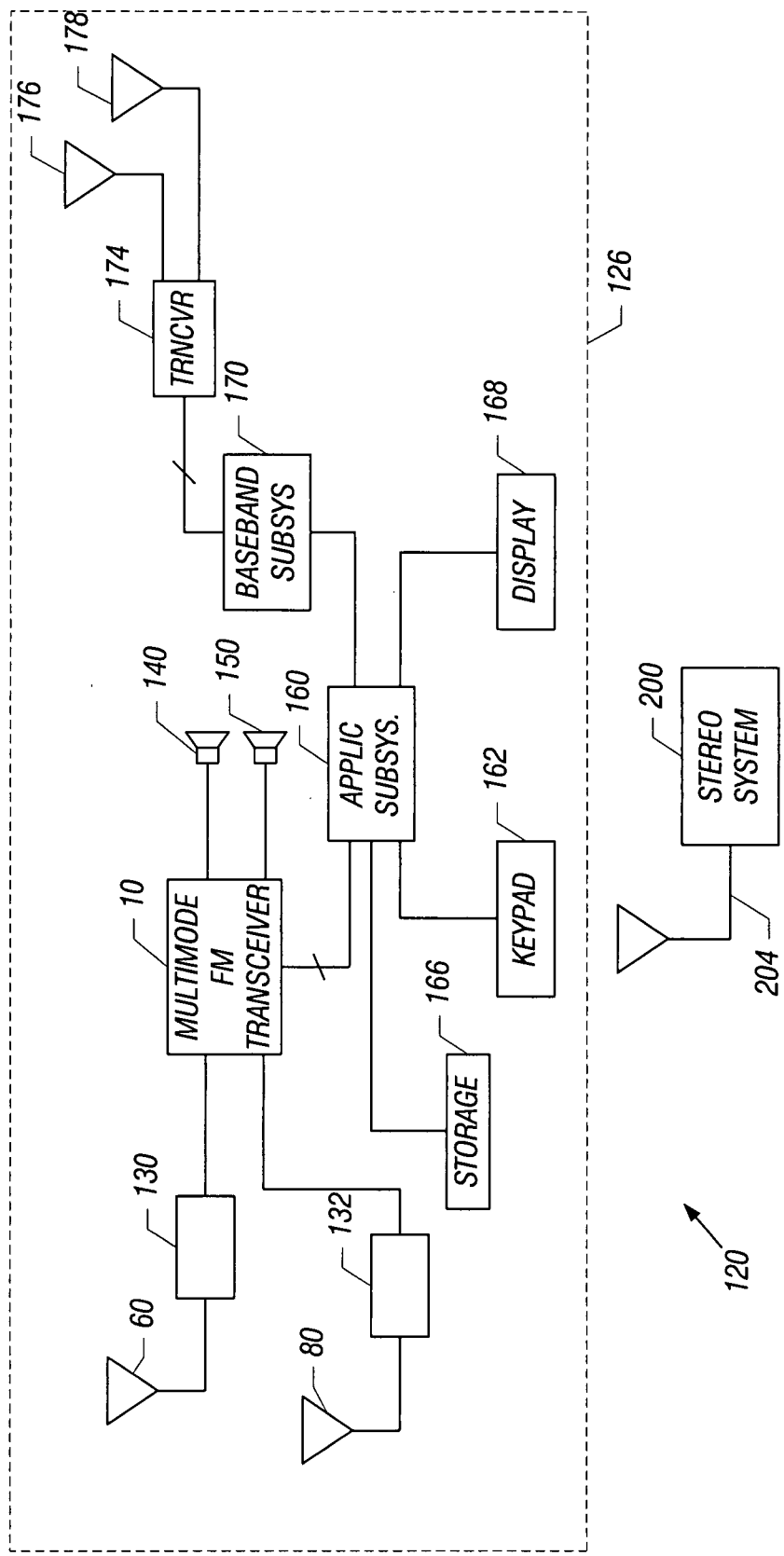
FIG. 2 is a schematic diagram of a wireless system according to an embodiment of the invention.

Referring to FIG. 2, in accordance with some embodiments of the invention, the multimode FM transceiver 10 may be part of a multimedia portable wireless device 126, which, in turn, is part of a wireless system 120. As examples, the wireless device 126 may be a dedicated MP3 player; a cellular telephone or personal digital assistant (PDA) with the capability of playing music downloads; part of a wireless link between a satellite antenna and an FM receiver; etc.

Among its other various functions, the wireless device 126 may store digital songs on storage 166, which may be a flash memory or hard disk drive, as just a few examples. The wireless device 126 generally includes an application subsystem 160 that may, for example, receive input from a keypad 162 of the wireless device 126 and display information on a display 168. Furthermore, the application subsystem 160 may generally control the retrieval and storage of songs from the storage 166 and the communication of the songs (via the DIN data signal (see FIG. 1), for example) with the multimode FM transceiver 10. As shown, the multimode FM transceiver 10 may be directly connected to relatively low power left channel 140 and right channel 150 speakers for purposes of playing a stored song, a mixed version of the song or other sounds, as further described below. As depicted in FIG. 2, the multimode FM transceiver 10 may be coupled by a matching network 130 to the receive antenna 60 and may be coupled by a matching network 132 to the transmit antenna 80.

Although the wireless device 126 may include the speakers 140 and 150, it may be desirable to play sounds that are generated by the wireless device 126 over a more sophisticated speaker system. Therefore, in accordance with some embodiments of the invention, the wireless device 126, via the multimode FM transceiver 10, may broadcast content to be played over an FM channel to the receiver of an adjacent stereo system 200 (as an example). As shown, the stereo system 200 includes an RF antenna 204 for purposes of receiving the transmitted content from the wireless device 126.

In accordance with some embodiments of the invention, the wireless device 126 may have the ability to communicate over a communications network, such as a cellular network. For these embodiments of the invention, the wireless device 126 may include a baseband subsystem 170 that is coupled to the application subsystem 160 for purposes of encoding and decoding baseband signals for this wireless network. A baseband subsystem 170 may be coupled to a transceiver 174 that is connected to corresponding transmit 176 and receive 178 antennas. For these embodiments of the invention, the multimode FM transceiver 10 may be used to mix in audio content for purposes of indicating operation of the baseband subsystem 170. For example, in accordance with some embodiments of the invention, in response to an incoming phone call, the multimode FM transceiver 10 may mix an audible ring signal that lets a listener of the wireless device 126 be aware that an incoming call is being received. Other embodiments are possible and are within the scope of the appended claims.

Figure 3:
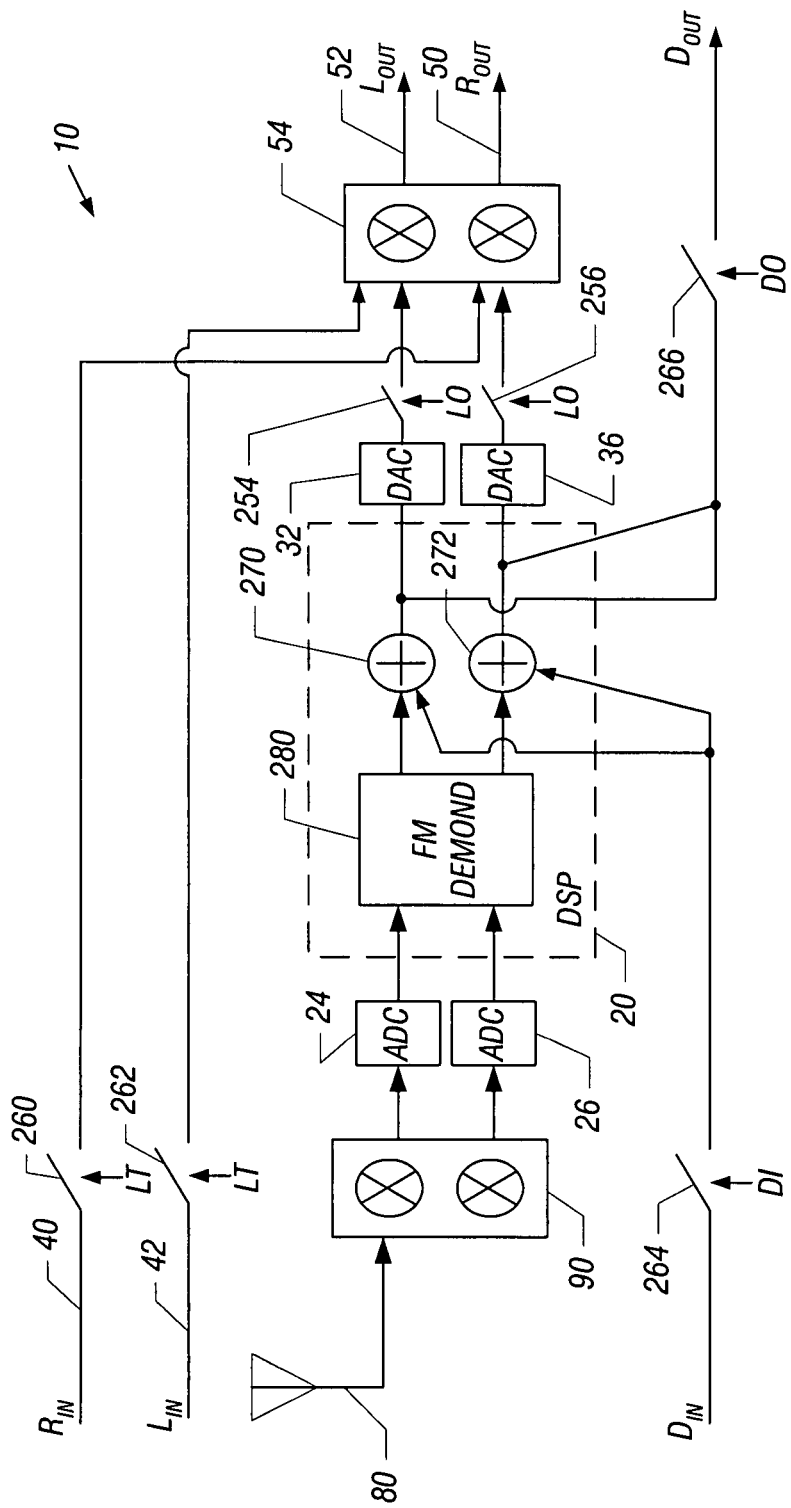
FIG. 3 is a schematic diagram of the multimode FM transceiver illustrating operation of the transceiver when in an FM receive mode according to an embodiment of the invention.

In accordance with some embodiments of the invention, when in the FM receive mode, the multimode FM transceiver 10 may establish the general signal flow that is depicted in FIG. 3. The various functions (i.e., submodes of the FM receive mode) that may be provided by the multimode FM transceiver 10 during the FM receive mode are controlled, in general, by four bits that may be written via the control interface 38 (see FIG. 1): a bit (called "DI"), which controls the enablement of the DIN digital data input signal; a bit (called "DO"), which controls the enablement of the DOUT digital data out signal; a bit (called "LO"), which controls the enablement of the LOUT and ROUT stereo channel signals; and a bit (called "LT") that controls enablement of the RIN and LIN stereo channel input signals. A bit called "RX," which also may be written via the control interface 38, is used to select the FM receive mode.

Conceptually, the DI signal generally controls the state of a switch 264, which controls communication of the DIN signal with the DSP 20. The DO signal generally controls a switch 266 that controls communication of the DOUT signal from the DSP 20. The LO signal controls two switches 254 and 256: the switch 254 controls communication between the output terminal of the DAC 32 and the mixer 54; and the switch 256 controls communication between the output terminal of the DAC 36 and the mixer 54. The LT signal controls the states of two switches 260 and 262: the LT signal controls the state of a switch 260, which is coupled between the RIN right stereo channel signal input terminal 40 and the mixer 54; and the LT signal also controls the state of a switch 262, which is coupled between the LIN stereo channel input signal terminal 42 and the mixer 54.

The combination of the LT, LO, DO and DI signals provide up to sixteen possible submodes for the FM receive mode, as depicted in the chart of FIG. 4. Some of these submodes, however, may not be used and as such are indicated as being "invalid" in FIG. 4. For example, for submode one (an "invalid mode") that is depicted in FIG. 4, all of the LT, LO, DO and DI bits are de-asserted to disable all of the input and output signals to and from the multimode FM transceiver 10.

As examples of the possible submodes for the FM receive mode, the LT signal may be asserted (a logic one bit, for example) to couple the RIN and LIN stereo channel signals to the analog mixer 54. If the LO signal is also asserted (a logic one bit, for example), then the RIN and LIN stereo channel signals may be mixed with the received content from a selected FM channel. If the LT signal is asserted and the LO signal is, however, de-asserted (a logic zero bit, for example), then a microphone (connected to the terminals 40 and 42) may be used to play a user's voice directly over the output speakers 140 and 150 (see FIG. 2, for example) of the wireless device 126. As another example, if the DI signal is asserted, then the multimode FM transceiver 10 may be used for purposes of digital mixing in which the DIN digital input signal may be mixed with the content received from the FM channel. For example, in accordance with some embodiments of the invention, the DI signal may be asserted for purposes of mixing a digital ring tone signal with the received FM content to audibly indicate an incoming phone call. The assertion of the DO signal may be used for purposes of digital recording. Thus, in accordance with some embodiments of the invention, the mixed FM content and DIN digital input signal may be sent to the DOUT digital output signal for purposes of permitting the application subsystem 160 (see FIG. 2) to digitally record the mixed signal. Other variations are possible.

As depicted in FIG. 3, in accordance with some embodiments of the invention, in addition to performing FM demodulation (as depicted by box 280), the DSP 20 may also perform digital mixing, as depicted by the mixers 270 and 272. Thus, the mixer 270 may be used for purposes of mixing for the left stereo channel, and the mixer 272 may be used for purposes of mixing for the right stereo channel. As depicted in FIG. 3, the DOUT digital output signal is derived from the output of the mixers 270 and 272.

Figure 5:
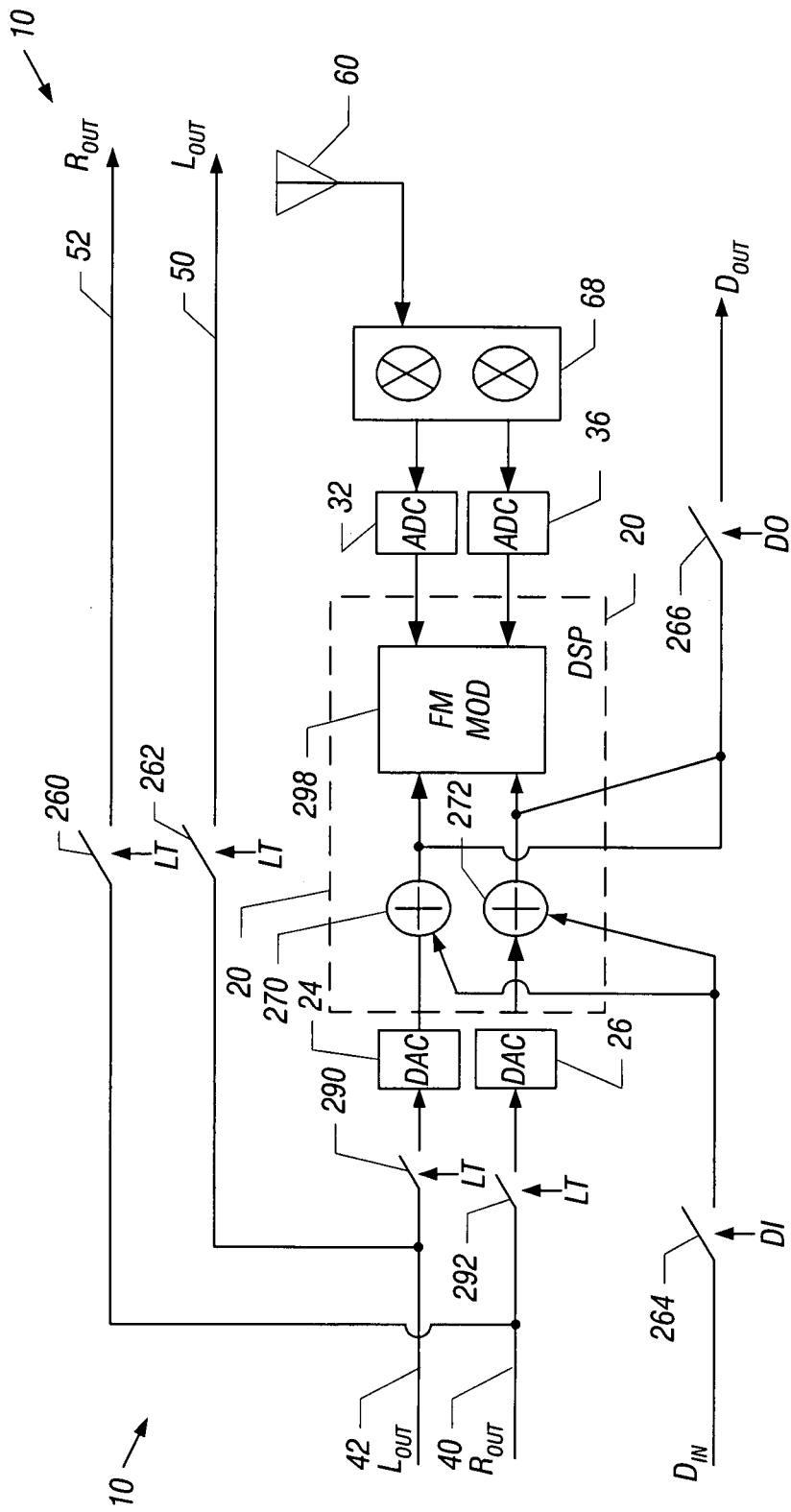
FIG. 5 is a schematic diagram of the multimode FM transceiver illustrating operation of the transceiver when in an FM transmit mode according to an embodiment of the invention.

In accordance with some embodiments of the invention, the multimode FM transceiver 10 has the general signal flow, which is depicted in FIG. 5, for the FM transmit mode. Referring also to FIG. 6 that depicts all of the possible submodes, the particular submode of the FM transmit mode is generally programmed in response to four signals: the LT signal, the DO signal, the DI signal and a signal called "LI." The LI signal, when asserted, enables connection of the LIN left channel stereo input terminal 42 and the RIN right channel stereo input terminal 40 to the ADC 24 and the ADC 26, respectively. Additionally, a signal called "TX" is used to place the multimode FM transceiver 10 in the FM transmit mode.

As depicted in FIG. 6, twelve possible "valid" submodes of the FM transmit mode may be achieved by manipulating the states of the LT, LI, DO and DI signals in accordance with some embodiments of the invention. Referring back to FIGS. 5 and 6, as an example, in accordance with some embodiments of the invention, the LI signal may be asserted to cause the switches 290 and 292 to couple the LIN and RIN stereo channel signals to the ADCs 24 and 26. The ADCs 24 and 26, in turn, provide digitized representations of the LIN and RIN stereo channel signals to the DSP 20. The digital adders 270 and 272 of the DSP 20 digitally mix the digitized LIN and RIN signals with the incoming DIN signal (if the DI signal is asserted) and then performs FM modulation to transmit the mixed content over the FM channel to a nearby stereo system, for example. Thus, the LI signal may be asserted for purposes of transmitting the LIN and RIN signal content out over the selected FM channel. This may be used, for example, for purposes of mixing output signals from a microphone (connected to the terminals 40 and 42) so that audio input from the user may be mixed with a song that is played back (received via the DIN signal) and played over the stereo channels.

As another example, the LIN and RIN stereo channel signals may be used to communicate audio content to be transmitted out over the RF FM channel, while the DIN signal indicates a ring tone to play over the channel. As yet another example, the LI signal may be de-asserted and the DI signal may be asserted to facilitate direct digital transmission by the multimode FM transceiver 10. As yet another example, the DO signal may be asserted for purposes of performing digital recording of the digital signals provided by the mixers 270 and 272. Thus, many combinations are possible in accordance with the many different possible embodiments of the invention.

Figure 7:
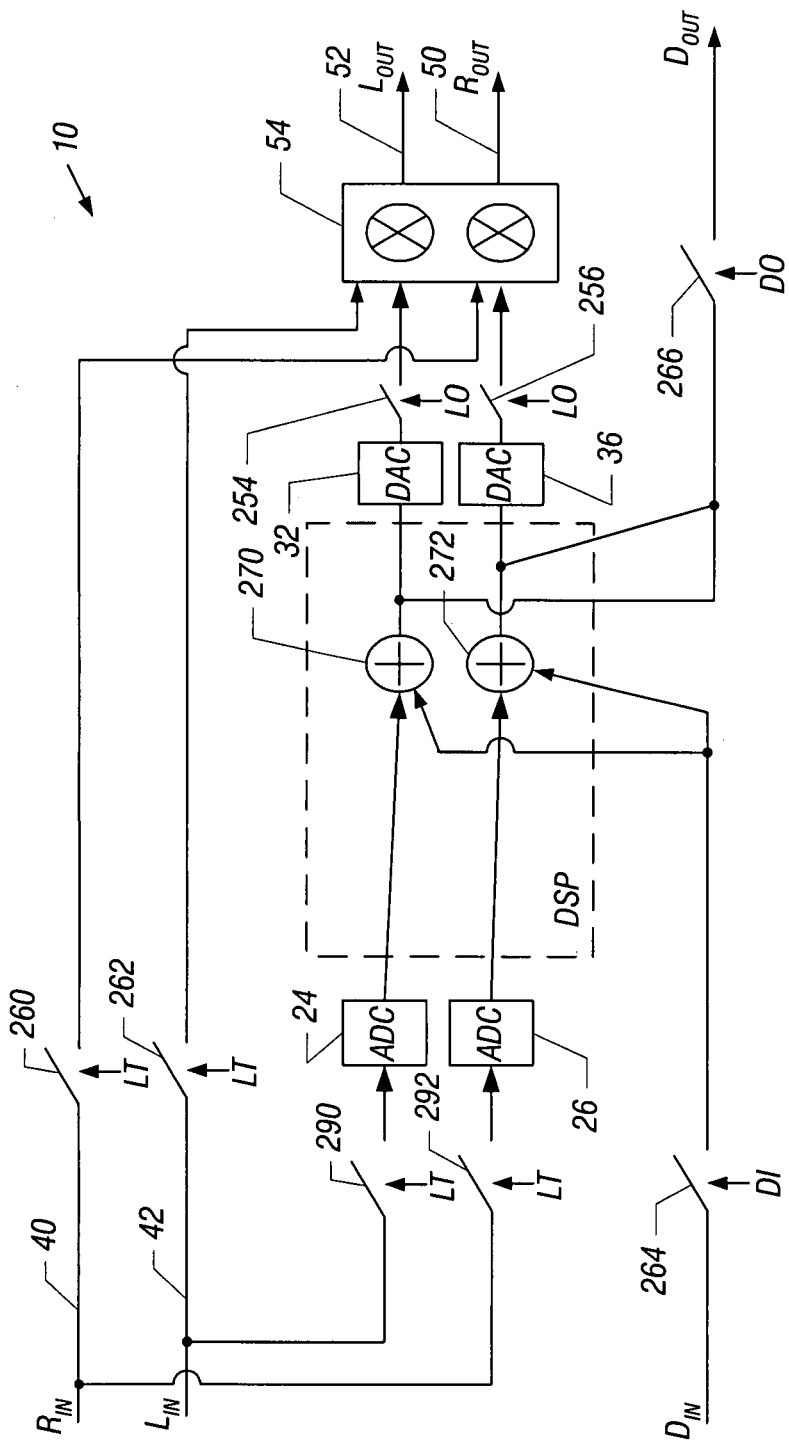
FIG. 7 is a schematic diagram illustrating an audio mode of the multimode FM transceiver according to an embodiment of the invention.

FIG. 7 depicts the general signal flow for the multimode FM transceiver 10 for the audio mode. In the audio mode, the transceiver 10 may perform analog-to-digital conversion, digital-to-analog conversion, line bypass, analog mixing and digital mixing. The submodes for the audio mode are controlled by the LT, LO, LI, DO and DI signals, in accordance with some embodiments of the invention. In particular, thirty-two submodes may be possible in the audio mode, as depicted in FIG. 8, in accordance with some embodiments of the invention. In general, the audio mode may be selected by the TX and RX signals being de-asserted in accordance with some embodiments of the invention.

As an example of the possible submodes, in accordance with some embodiments of the invention, analog-to-digital conversion of the RIN and LIN stereo channel signals may be accomplished by asserting the LI and DO signals. Thus, the DOUT signal for this submode indicates the digitized version of the RIN and LIN stereo channel signals. As another example, digital-to-analog conversion of the DIN signal may be accomplished by asserting the DI and LO signals. In this mode, the DACs 32 and 36 form the LOUT and ROUT signals, which indicate the analog left and right channel signals derived from the DIN digital input signal. Regarding mixing, digital mixing may be accomplished by asserting the DI and LI signals. Thus, the RIN and LIN stereo channel signals are digitized and mixed with the DIN data signal via the mixers 270 and 272. The digital output may then be obtained by asserting the DO signal so that the DOUT signal indicates the digitally mixed signal. Analog mixing may likewise be performed. For example, the DI, LO and LT signals may be asserted so that analog representations of the DIN signal appear at the mixer 54, which mixes the RIN and LIN signals with these analog signals to produce the analog LOUT and ROUT signals. As yet another variation, a line bypass may be performed by asserting the LT signal and de-asserting the LO signal to couple the stereo input terminals 40 and 42 to the stereo output terminals 50 and 52, respectively. Thus, many variations are possible and are within the scope of the appended claims.

Referring back to FIG. 1, in accordance with some embodiments of the invention, the ADC 24, 26 may be a delta sigma modulator (DSM). Due to the reuse of the ADCs 24 and 26 in the different operating modes of the multimode FM transceiver 10, the ADCs 24 and 26 processes either a pair of independent real stereo signals or an interrelated pair of I and Q quadrature signals, depending on the selected mode.

A real signal may be defined as an electrical time-varying physical quantity (of the real world), i.e., a voltage, current or power. The real signal is characterized by a symmetric spectrum for positive and negative frequencies, i.e., the center frequency of its spectrum may be represented by two phasors of the same amplitude rotating at the equal and opposite rotational frequency. A complex, or quadrature signal may be defined as a signal that can be represented by two real signals, the real or in-phase (I) or imaginary or quadrature (Q) parts, such that the center frequency of its spectrum can be represented by a single phasor rotating with positive or negative rotational frequency. If half of the bandwidth is smaller than its center frequency, then the signal spectrum has only positive and negative frequency components. Conversely, there will be a nonsymmetrical spectrum with respect to DC, which extends to DC itself. Based on this definition, the case of a passband spectrum which is not symmetric (i.e., which not extend up to DC), is not considered as a complex signal, but the superimposition of two complex signals. In fact, the center frequencies of the two passband spectrum may be represented by two phasors of different amplitude rotating in opposite directions. This situation happens for instance in presence of mismatches in I and Q paths: the two center frequency components can be represented by two phasors of different amplitude rotating in equal opposite directions. Note also as a real signal itself can be considered as the superimposition of two complex signals.

For a downconverted quadrature (I/Q) low-IF or zero-IF radio signals, the DSM can be operated either in real or complex configuration, as the in-phase (I) and quadrature (Q) real signals represent the real and imaginary parts of the same complex signal. In particular, the complex configuration is particularly advantageous in terms of signal-to-noise ratio (SNR) for low-IF signal, especially if the IF frequency is not that low with respect to the signal bandwidth. Conversely, for stereo audio signal only the real configuration can be used, because the LIN and RIN stereo channel signals are two completely independent real signals.

Although the discussion below considers only discrete time (DT)-based DSM, embodiments of the invention may also include continuous-time DSM (CT-DSM), as a CT-DSM is equivalent to a DT-DSM with an anti-aliasing filter (AAF) front-end.

Figure 9:
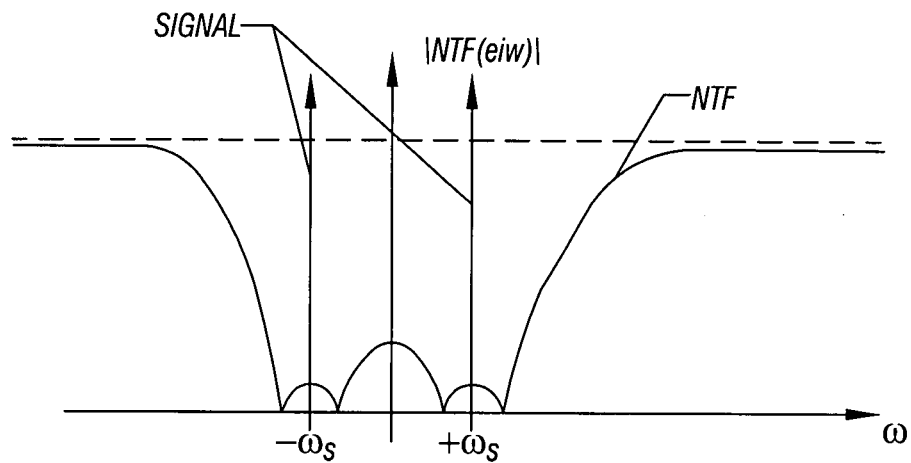
FIG. 9 illustrates a noise transfer function of a real discrete time delta sigma modulator according to an embodiment of the invention.

FIG. 9 shows a possible fourth-order noise-transfer function (NTF) of a real discrete time (DT) DSM, where the zeros have been optimized for the bandwidth of the signal. As shown, the amplitude of the transfer function for a real block is an even function of the frequency, i.e., is symmetric with respect to DC. Also the signal is symmetric with respect to DC. The angular frequency $\omega_s$ represents the center frequency of the signal. This architecture can also be used to process complex signals, with two identical systems: one for I and one for Q. The complex representation of the NTF will be the same while the signal will have only one spectral row, for positive or negative frequency.

Figure 10:
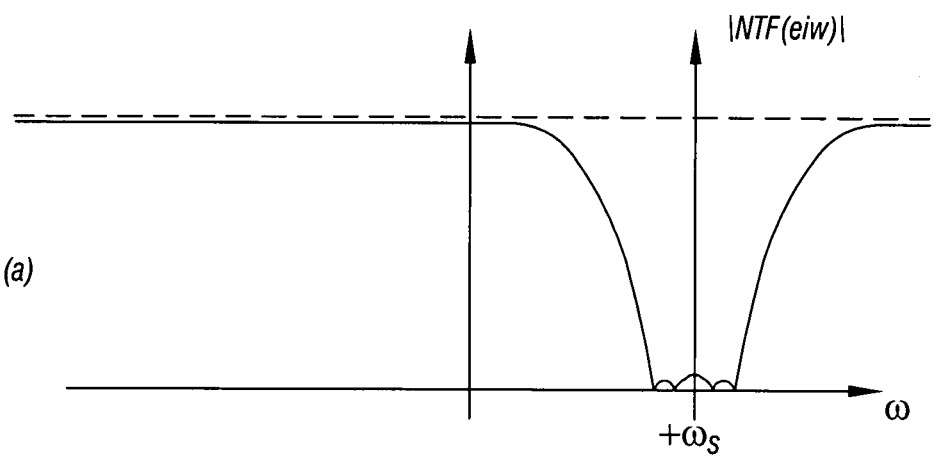
FIG. 10 is a noise transfer function for positive frequencies for a complex discrete time delta sigma modulator according to an embodiment of the invention.
Figure 11:
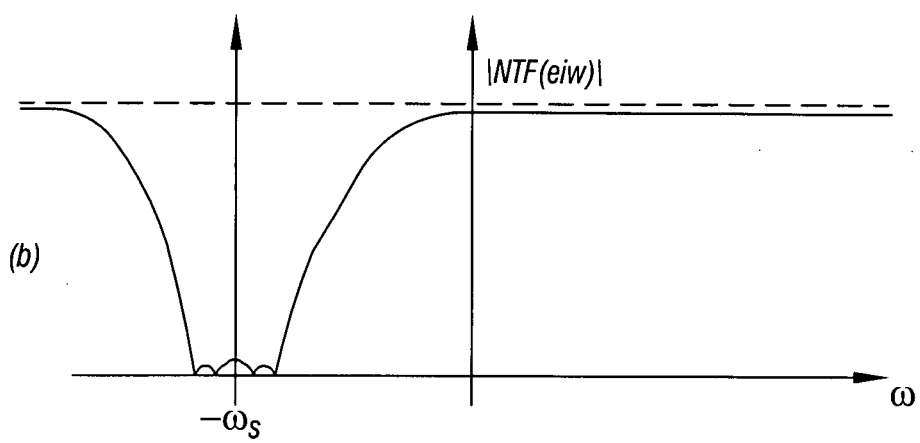
FIG. 11 is a noise transfer function for negative frequencies for a complex discrete time delta sigma modulator according to an embodiment of the invention.

FIGS. 10 and 11 show a possible fourth-order noise-transfer function (NTF) of a complex DSM, where the zeros have been optimized for the bandwidth of the signal. As it can be seen, the function is not symmetric with respect to DC but it is symmetric with respect to the center frequency of the signal bandwidth. In the complex signal case, this allows to place all the four zeros in the BW of interest, and by so doing obtaining, in general, a better SNR.

Figure 12:
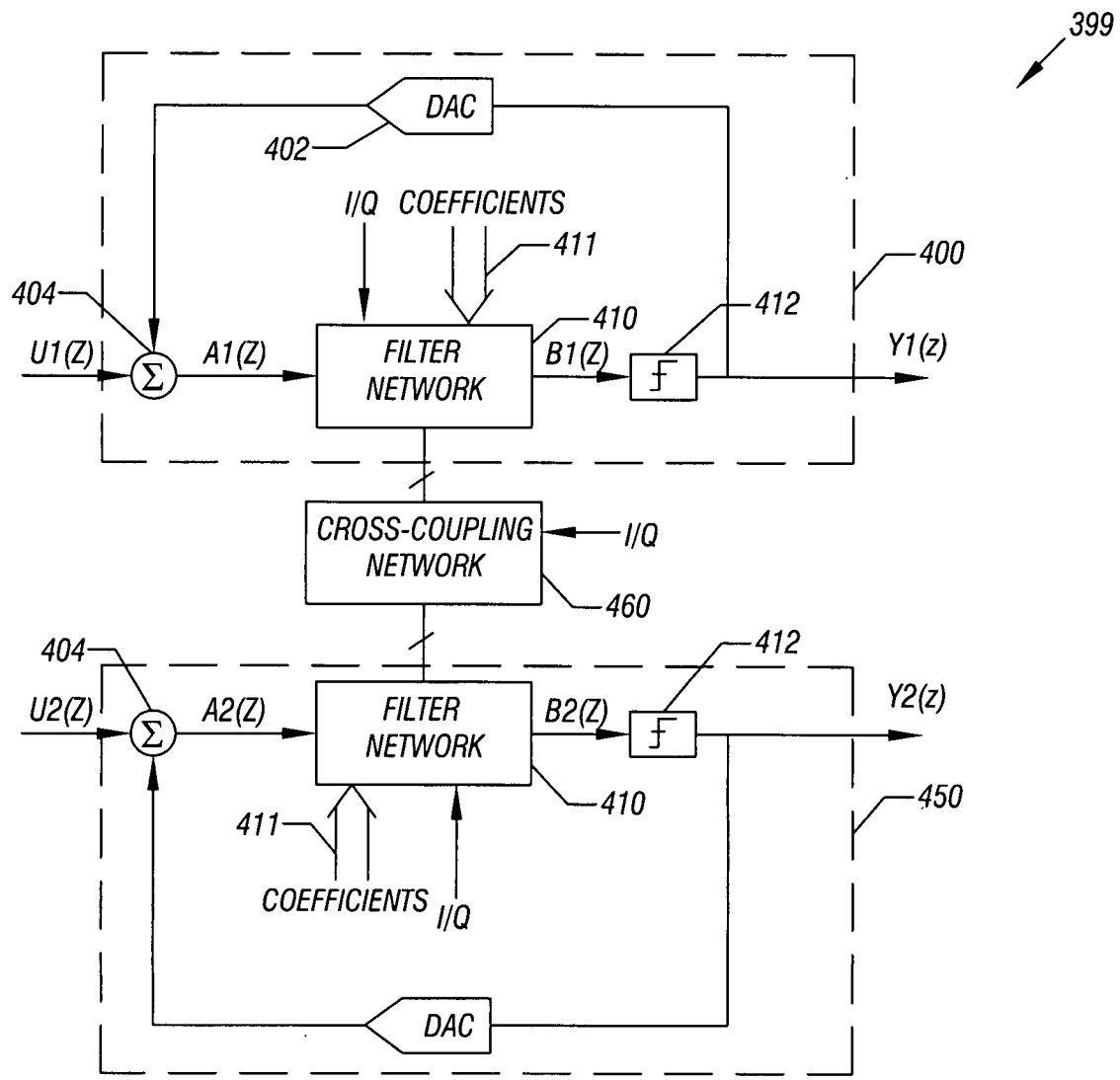
FIG. 12 is a schematic diagram of an analog-to-digital converter architecture according to an embodiment of the invention.

Referring to FIG. 12, in accordance with some embodiments of the invention, the ADCs 24 and 26 may together have a digital-to-analog converter architecture 399. In particular, the architecture may include two delta sigma modulators (DSM) 400 and 450, each of which has a similar design. Each DSM 400, 450 receives an analog signal and converts this analog signal into its digital counterpart. For example, the DSM 400 receives an analog signal (called "U1(z)") and provides a digital signal (called "Y1(z)"). Similarly, the DSM 450 receives an analog signal called "U2(z)" and provides a digital signal called "Y2(z)." As depicted in FIG. 12, a cross-coupling network 460 potentially couples the DSMs 400 and 450 together, depending on whether the ADCs 24 and 26 process independent, real signals or two interrelated signals that represent the I and Q components of a complex signal.

More specifically, when the ADCs 24 and 26 process independent real signals (such as the LIN and RIN stereo channel signals, for example), the cross-coupling network 460 is decoupled from the DSMs 400 and 450 so that the DSMs 400 and 450 are each independent to produce the corresponding digital counterpart signal. However, when the U1(z) and U2(z) signals are quadrature signals (i.e., interrelated real signals that represent the I and Q components of a complex signal), the cross-coupling network 460 couples the DSMs 400 and 450 together to produce the corresponding quadrature digital signals that appear as the Y1(z) and Y2(z) signals. As depicted in FIG. 12, in accordance with some embodiments of the invention, the cross-coupling network 460 receives a signal (called "I/Q"), a signal that may be asserted (for example) to cause the cross-coupling network 460 to effectively "disappear," and de-asserted (for example) to cross-couple the DSMs 400 and 450 to process the quadrature signals.

As depicted in FIG. 12, in accordance with some embodiments of the invention, the DSM 400 includes a summing node 404 that receives an output signal from a DAC 402, which converts the Y1(z) digital output signal into an analog signal. The summing node 404 subtracts the signal that is provided by the DAC 402 from the input signal U1(z). This produces a signal (called "A1(z)") that is provided to a filter network 410 of the DSM 400. The filter network 410, in turn, provides an output signal (called "B1(z)") that is provided to a quantizer 412, which provides the Y1(z) output signal. It is noted that the quantizer 412 performs noise shaping so that the DSP 20 (see FIG. 1) may easily remove noise from the digitized signal. The filter network 410 also receives the I/Q signal and receives indications of coefficients for the filter network 410 via a bus 411. Thus, depending on the state of the I/Q signal, the filter network 410 adapts its structure accordingly. Furthermore, the coefficients that are programmed into the filter network 410 via the bus 411 change according to whether the DSM 400 is processing independent real signals or quadrature signals.

The DSM 450 may have a similar structure to the DSM 400 in accordance with some embodiments of the invention.

Figure 13:
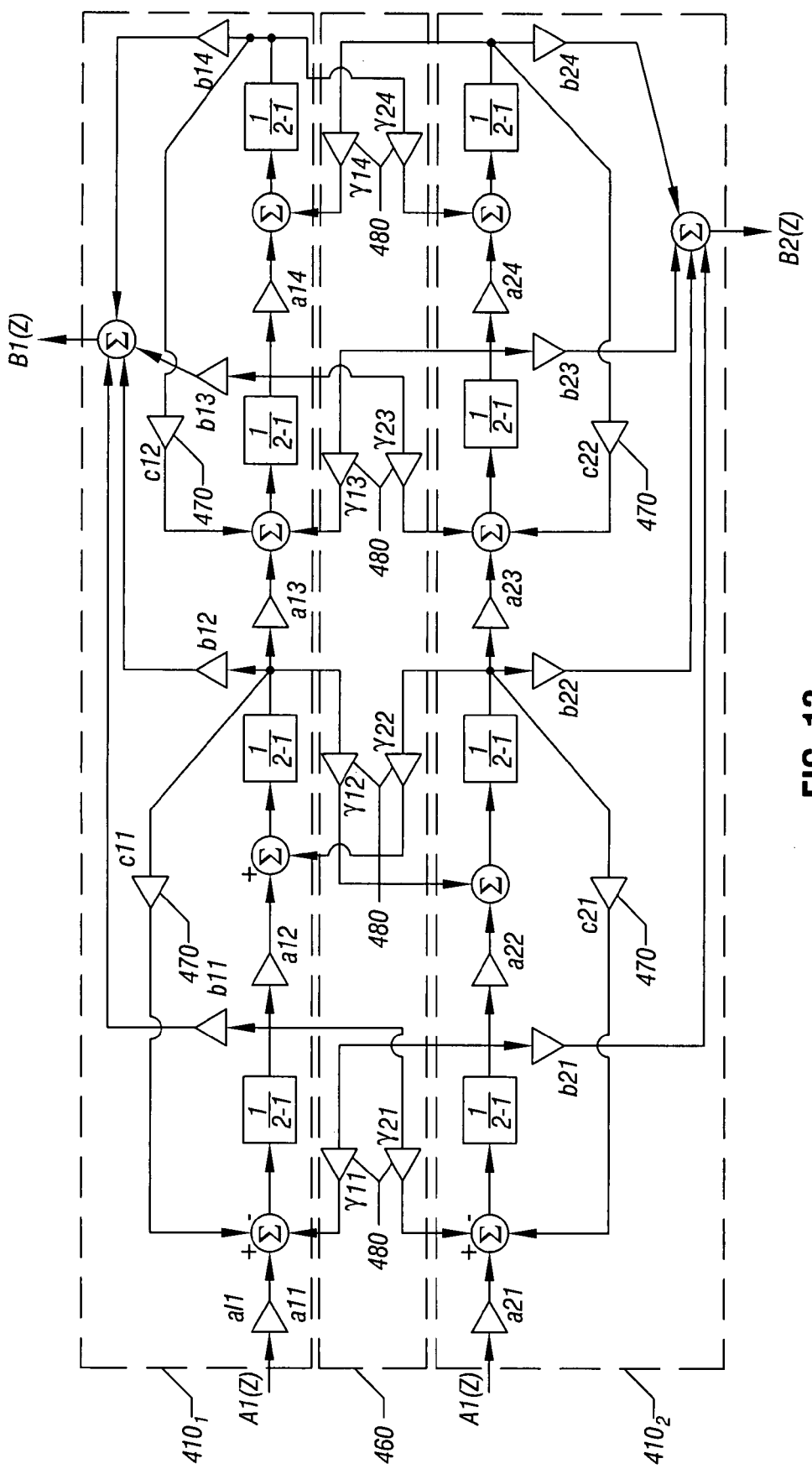
FIG. 13 is a schematic diagram of a loop filter of the analog-to-digital architecture of FIG. 12 according to an embodiment of the invention.

As a more specific example, FIG. 13 depicts, in the Z-domain, a filter $410_1$ (i.e., an embodiment of the filter 410) of the DSM 400, a filter $410_2$ (i.e., an embodiment of the filter 410) of the DSM 450 and the cross-coupling network 460 that is coupled in between. The filter networks $410_1$ and $410_2$ are each a fourth order, real Chebychev-type filter in accordance with some embodiments of the invention. Each filter network $410_1$, $410_2$ includes coefficient gains 470 that are non-zero when the DSMs 400 and 450 are processing independent real signals and are set to zero (to effectively remove the gains) when the DSMs 400 and 450 are processing interrelated quadrature signals of a complex signal. The cross-coupling network 460 also includes gains 480 that are non-zero when the DSMs 400 and 450 are processing the interrelated quadrature signals and are zero when the DSMs 400 and 450 are processing the independent real signals.

Figure 14:
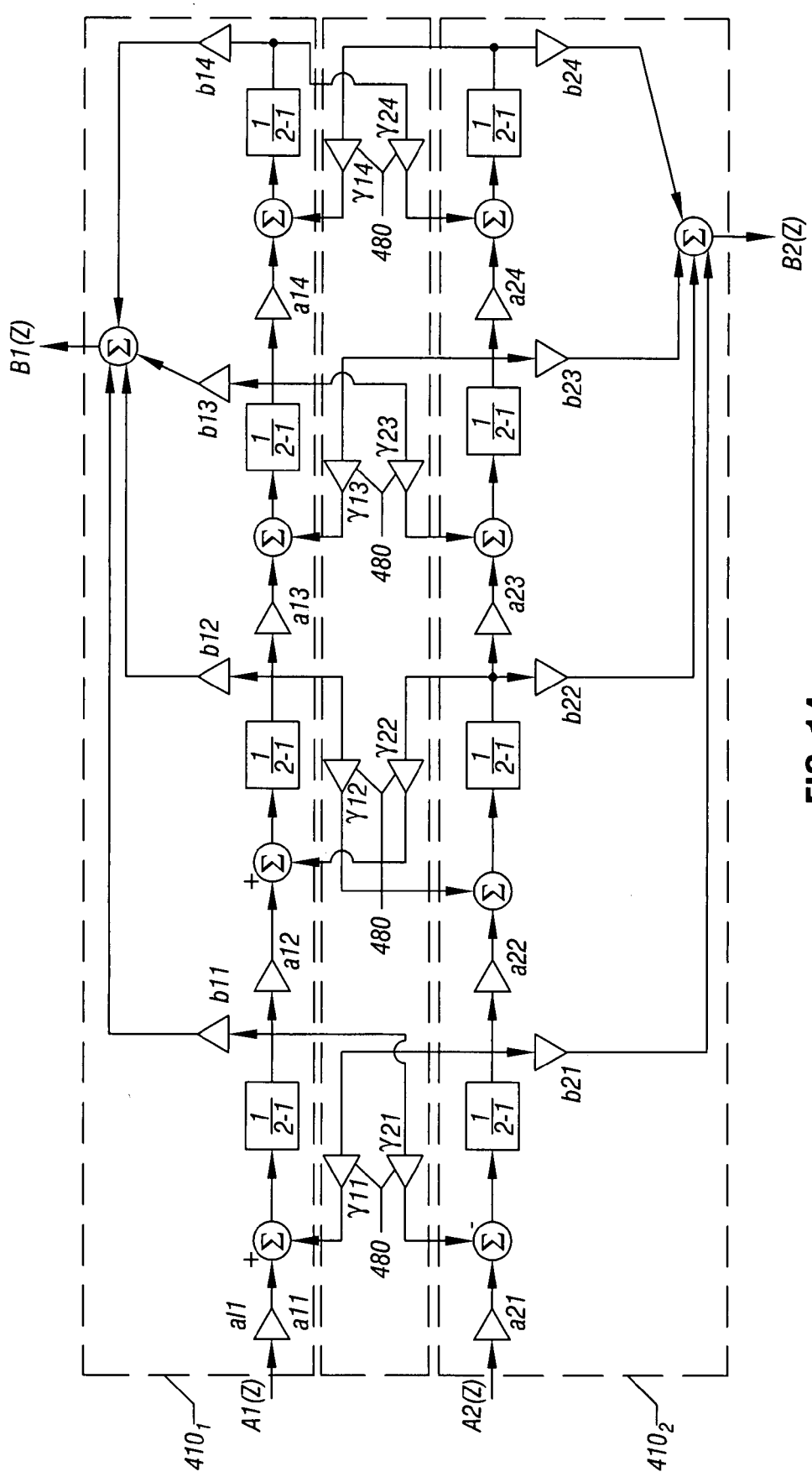
FIG. 14 is a schematic diagram illustrating the loop filter of FIG. 13 when configured to process quadrature signals according to an embodiment of the invention.

Thus, referring also to FIG. 14, for the case when the DSMs 400 and 450 are processing quadrature signals, the gains 470 effectively disappear as depicted in FIG. 14. It is noted that the various remaining gains for the filter networks $410_1$ and $410_2$ are programmed, or adjusted, for processing of the quadrature signals to adjust the zeros and center frequency of the effective loop filter.

In accordance with some embodiments of the invention, the MCU 110 (FIG. 1) may control the generation of the I/Q signal and the programming of the filter coefficients, depending on the mode of the multimode RF transceiver 10.

Figure 15:
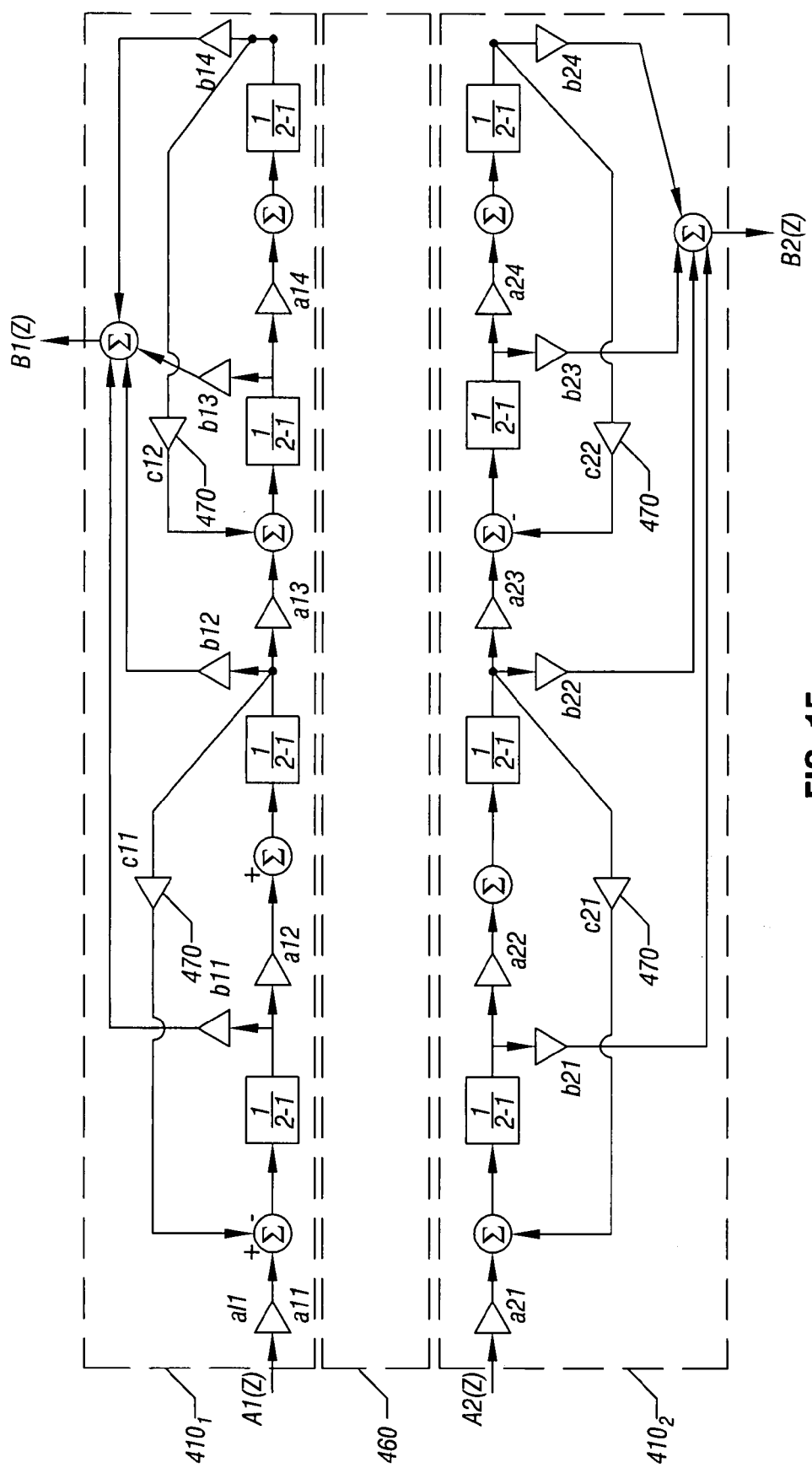
FIG. 15 is a schematic diagram of the loop filter of FIG. 13 when configured to process a real signals according to an embodiment of the invention.

In FIG. 15, which depicts the filter networks $410_1$, $410_2$ and 460 during the DSM's processing of real signals, the gains 480 (see FIG. 13) are zero, and the gains 470 are adjusted for processing the independent real signals. Thus, effectively, the cross-coupling network 460 disappears when the DSMs 400 and 450 are processing independent real signals.

Figure 16:
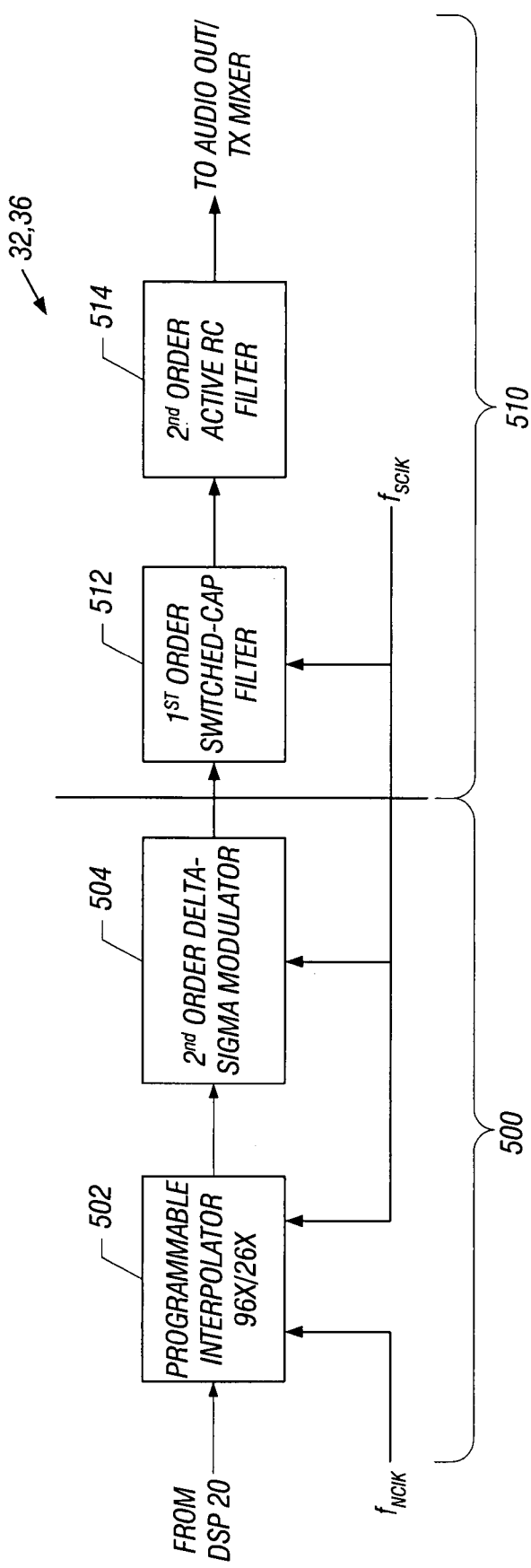
FIG. 16 is a schematic diagram of a digital-to-analog converter of the multimode FM transceiver according to an embodiment of the invention.

Referring to FIG. 16, in accordance with some embodiments of the invention, each DAC 32, 36 may have the following design. The DAC 32, 36 includes a digital side 500 and an analog side 510. The digital side 500 includes a programmable interpolator 502 and second order delta sigma modulator 504. The analog side 510 includes a first order switched capacitor filter 512 and a second order active RF filter 514.

For the FM receive mode of the multimode FM transceiver 10, the signal coming from the DSP has a bandwidth of 16 kHz (as an example), whose Nyquist frequency $f_{Nclk}$ is 32 kHz (as an example). The programmable interpolator 502 interpolates this signal by 96 times (as an example) which means the oversampling ratio is 96 and the oversampling frequency $f_{Sclk}$ is about 3 MHz. This over-sampled signal is then processed by the second order delta sigma modulator 504 to produce a one bit stream.

The above components are implemented in digital hardware. The one-bit stream is the filtered by the first-order switched capacitor filter 512 to remove out of band quantization noise and reconstruct into analog signal. The active RF filter 514 further smoothes the signal. The order of the filters are chosen to minimize area and power. Higher order filters may be used to improve performance. The signal from time active RF filter 514 may be sent to a headphone amplifier to drive a speaker.

For the FM transmit mode of the multimode FM transceiver 10, the signal experiences the same processing procedure. But due to the wider signal bandwidth, $f_{Nclk}$ is now 456 kHz (as an example). The oversampling ratio is 26 times (as an example) and $f_{Sclk}$ is about 12 MHz (as an example). This is possible because the FM transmission SNR requirement is much relaxed than the receiving path. The delta sigma modulator 504 is still second order but is reconfigured to pass a signal centered at 128 kHz with a bandwidth of 200 kHz.

For the receiver modulator, the zero location of the noise transfer function is put at DC, but for the transmitter modulator, the zero position is optimized and is put around 128 kHz. The bandwidth of the switched cap active filter 512 may be changed to accommodate the signal by switching off part of the integration capacitor. The bandwidth of the active RF filter 514 is also programmed accordingly.

Many variations are possible and are within the scope of the appended claims. For example, FIG. 5 depicts a transmit path architecture in which the DSP 20 performs FM modulation, as indicated by block 298. Thus, in this embodiment of the invention, the DSP 20 receives the left and right audio input signals from the ADCs 24 and 26, respectively and generates, as described above, quadrature signals (called "I" and "Q"), which are converted into analog signals by the DACs 32 and 36. In this embodiment of the invention, the analog mixer 68 may be complex mixers in that the mixers convert the quadrature I and Q signals into a single signal for purposes of driving the antenna 60. It is noted that the arrangement that is disclosed in FIG. 5 is merely an example of many possible ways to implement a transmit path in accordance with the many possible embodiments of the invention.

Figure 17:
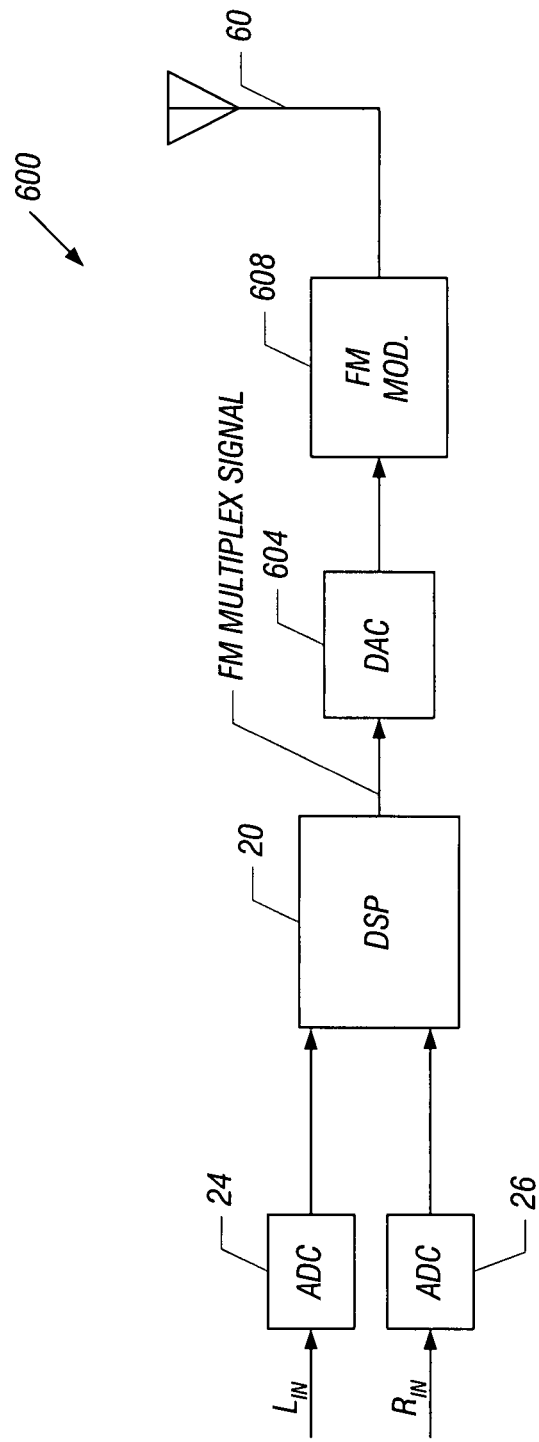
FIGS. 17 and 18 are schematic diagrams of transmit paths for the transceiver according to embodiments of the invention.

For example, the transmit path that is depicted in FIG. 5 may be replaced by an alternative transmit path 600 of the transceiver 10, which is schematically depicted in FIG. 17. In this regard, the transceiver 10 may use some of the previously-disclosed components of the transceiver 10, as further described below. Referring to FIG. 17, in the transmit path 600, the DSP 20 receives digitized left and right channel audio signals from the ADCs 24 and 26, respectively. However, instead of generating the quadrature I and Q signals, the DSP 20 instead generates an FM multiplex signal. As can be appreciated by those skilled in the art, the FM multiplex signal is a single signal, which contains both the left and right channel stereo information. In this regard, the FM multiplex signal contains a pilot; spectral content indicative of a left channel plus right channel (L+R) signal; spectral content indicative of a left channel minus right channel signal (L−R); and possibly other data, such as RDS data, demarc data, etc.

In embodiments of the invention in which the transceiver implements the transmit path 600, the FM multiplex signal is received by a DAC 604, which may be, for example, one of the DACs 32 and 36 of the transceiver 10. The DAC 604 converts the digital FM multiplex signal from the DSP 20 into a corresponding analog signal, which is provided to an FM modulator 608. As examples, the FM modulator 608 may be an additional component of the transceiver 10, such as a voltage controlled oscillator (VCO) or analog modulator, as just a few examples. Thus, the FM modulator 608 generates an analog RF signal, which is communicated to the antenna 60.

Figure 18:
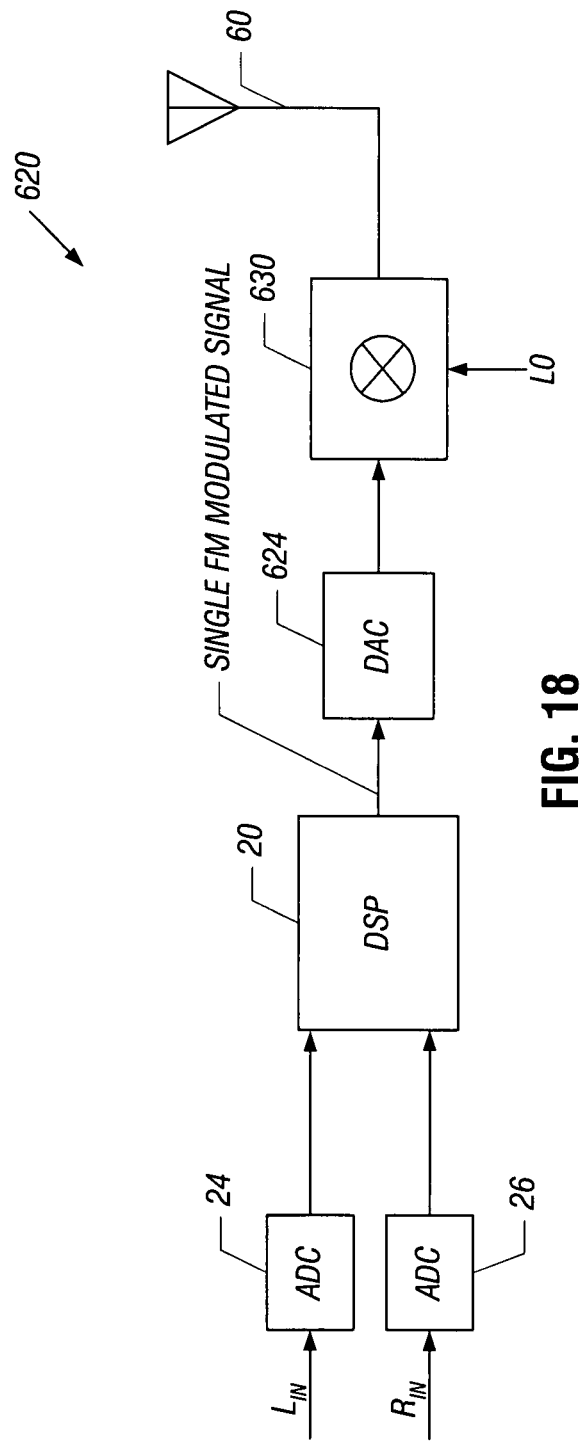

As an example of yet another variation, FIG. 18 depicts an alternative FM transmit path 620 of the transceiver 10 in accordance with other embodiments of the invention. Instead of generating the quadrature I and Q signals or the FM multiplex signal, in these embodiments of the invention, the DSP 20 generates a single FM modulated signal. The generation of the single FM modulated signal typically encounters challenges due to the inability to reject images. Thus, although the quadrature signals impart image rejection capability, it is possible that the image rejection may not be a problem for certain architectures; and thus, the transmit path 620 may have a less complex design. In these embodiments of the invention, a DAC 624 receives the single, digital FM modulated signal from the DSP 20 and converts the signal into an analog signal. The DAC 624 may be, for example, one of the DACs 32 or 36 of the transceiver 10. The analog signal FM modulated signal may be at the appropriate FM frequency or may be, for example, upconverted by a mixer 630 to the desired FM frequency to form the RF signal that is communicated to the antenna 60. In other embodiments of the invention, the DAC 624 may provide a signal that is at the correct frequency, and thus, the mixer 630 may be omitted.

Figure 19:
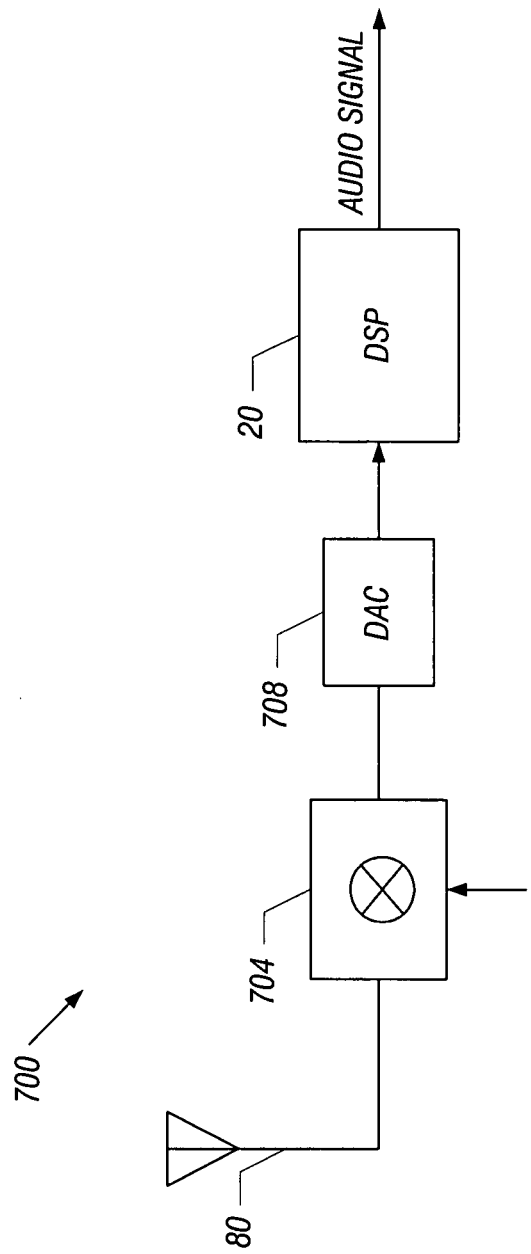
FIG. 19 is a schematic diagram of a receive path for the transceiver according to an embodiment of the invention.

Many variations may be made to the FM receive path in accordance with many different embodiments of the invention. In the embodiment depicted in connection with FIG. 3, the FM receive path is formed by producing (via the mixers 90) quadrature I and Q signals from the received RF signal. These quadrature signals pass through the ADCs 24 and 26 and onto the DSP 20, which performs FM demodulation. However, it is noted that in other embodiments of the invention, the transceiver 10 may alternatively contain an FM receive path, such as an FM receive path 700 that is depicted in FIG. 19. Referring to FIG. 19, in these embodiments of the invention, the RF signal that is received from the antenna 80 is not converted into the quadrature I and Q signals. Instead, the FM receive path 700 includes a non-complex mixer 704, which downconverts the received RF signal into a single lower frequency signal. The downconverted signal, which is furnished by the mixer 704 may be digitized by an ADC 708. ADC 708 may be, for example, one of the ADCs 24 and 26 of the transceiver 10. The digitized downconverted signal may then be provided to the DSP 20, which demodulates the signal to produce an audio signal.

Other variations are possible and are within the scope of the appended claims. For example, in some embodiments of the invention, the FM receive path may include an explicit FM demodulator, which processes a digital signal that is furnished by the DSP 20. In these embodiments of the invention, the DSP 20 may perform a variety of signal processing functions prior to the demodulation by the explicit FM demodulator.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A transceiver comprising:
   a processor adapted to:
      in a transmit mode of the transceiver, form at least part of a transmitter, and
      in a receive mode of the transceiver, form at least part of a receiver; and
   an analog-to-digital converter to provide a first digital signal to the processor and exhibit a first frequency response in the transmit mode to form at least part of the transmitter, and provide a second digital signal to the processor and exhibit a second frequency response different from the first frequency response in the receive mode to form at least part of the receiver,
   wherein the analog-to-digital converter comprises a filter network having changeable filter coefficients to select the first and second frequency responses.

2. The transceiver of claim 1, wherein the processor is adapted to generate an FM multiplex signal in the transmit mode.

3. The transceiver of claim 2, further comprising:
   a digital-to-analog converter adapted to receive the FM multiplex signal from the processor in the transmit mode.

4. The transceiver of claim 3, further comprising:
   an FM modulator to receive a digital signal from the digital-to-analog converter in the transmit mode.

5. The transceiver of claim 1, wherein the processor is adapted to generate quadrature signals in the transmit mode.

6. The transceiver of claim 1, wherein the processor is adapted to generate an FM modulated signal.

7. The transceiver of claim 1, wherein the processor is adapted to receive quadrature signals or a single signal indicative of received RF content in the receive mode.

8. The transceiver of claim 1, further comprising:
a semiconductor package containing the processor and the analog-to-digital converter.

9. The transceiver of claim 1, further comprising:
a die on which both the processor and the analog-to-digital converter are fabricated.

10. A method comprising:
forming at least part of a transmitter from a processor in a transmit mode of a transceiver;
forming at least part of a receiver from the processor in a receive mode of the transceiver;
communicating a first signal between an analog-to-digital converter of the transceiver and the processor in the transmit mode such that the analog-to-digital converter forms at least part of the transmitter;
communicating a second signal between the analog-to-digital converter and the processor in the receive mode to form at least part of the receiver; and
regulating a frequency response of the analog-to-digital converter based on whether the transmitter is in the transmit mode or in the receive mode, wherein the analog-to-digital converter comprises a filter network comprising changeable filter coefficients and regulating the frequency response of the analog-to-digital converter comprises selectively changing the filter coefficients.

11. The method of claim 10, further comprising:
using the processor to generate an FM multiplex signal in the transmit mode.

12. The method of claim 10, further comprising:
using the processor to generate quadrature signals in the transmit mode.

13. The method of claim 10, further comprising:
using the processor to generate an FM modulated signal in the transmit mode.

14. The transceiver of claim 1, further comprising:
a bus adapted to communicate the filter coefficients to the analog-to-digital converter to selectively cause the analog-to-digital converter to exhibit the first frequency response or the second frequency response.

15. The transceiver of claim 1, wherein the analog-to-digital converter comprises a filter network, the filter network adapted to exhibit first coefficient gains in the transmit mode and exhibit second coefficient gains different from the first coefficient gains in the receive mode.

16. The method of claim 10, wherein regulating the frequency response of the analog-to-digital converter comprises regulating the frequency response based at least in part on whether the analog-to-digital converter is processing interrelated quadrature signals or independent real signals.

* * * * *